(12) United States Patent
Walter et al.

(10) Patent No.: US 9,127,377 B2
(45) Date of Patent: Sep. 8, 2015

(54) GENERATING A HOMOGENEOUS MAGNETIC FIELD WHILE PULLING A SINGLE CRYSTAL FROM MOLTEN SEMICONDUCTOR MATERIAL

(75) Inventors: Wolfgang Walter, Wuerzburg (DE);
Cristian Boffo, Wuerzburg (DE);
Philipp Revilak, Wuerzburg (DE)

(73) Assignee: Babcock Noell GmbH, Wuerzburg (DE)

( * ) Notice: Subject to any disclaimer, the term of this patent is extended or adjusted under 35 U.S.C. 154(b) by 474 days.

(21) Appl. No.: 13/590,413

(22) Filed: Aug. 21, 2012

(65) Prior Publication Data

US 2014/0053771 A1    Feb. 27, 2014

(51) Int. Cl.
| | |
|---|---|
| C30B 15/22 | (2006.01) |
| C30B 30/04 | (2006.01) |
| H01F 38/00 | (2006.01) |
| C30B 15/30 | (2006.01) |
| H01F 6/04 | (2006.01) |
| H01F 6/06 | (2006.01) |
| C30B 29/06 | (2006.01) |
| C30B 29/08 | (2006.01) |
| C30B 29/42 | (2006.01) |

(52) U.S. Cl.
CPC ............... *C30B 30/04* (2013.01); *C30B 15/305* (2013.01); *H01F 6/04* (2013.01); *H01F 6/06* (2013.01); *H01F 38/00* (2013.01); *C30B 29/06* (2013.01); *C30B 29/08* (2013.01); *C30B 29/42* (2013.01); *Y10T 117/1068* (2015.01)

(58) Field of Classification Search
CPC ........ C30B 15/00; C30B 15/20; C30B 15/22; C30B 29/00; C30B 29/06; C30B 30/04; Y10T 117/00; Y10T 117/10; Y10T 117/1024; Y10T 117/1032

USPC ........ 117/11, 13, 30, 32, 200, 206, 208, 928, 117/931–932

See application file for complete search history.

(56) References Cited

U.S. PATENT DOCUMENTS

| | | | |
|---|---|---|---|
| 6,984,264 B2 | 1/2006 | Shimonosono et al. | 117/30 |
| 7,000,408 B2 | 2/2006 | Mitsubori | 62/6 |
| 2004/0107894 A1* | 6/2004 | Shimonosono et al. | 117/30 |
| 2004/0118334 A1 | 6/2004 | Weber et al. | 117/19 |
| 2008/0060572 A1* | 3/2008 | Fu et al. | 117/32 |
| 2009/0183670 A1* | 7/2009 | Cho et al. | 117/32 |
| 2010/0050929 A1* | 3/2010 | Hobl et al. | 117/13 |

FOREIGN PATENT DOCUMENTS

JP    2001-203106    1/2000

* cited by examiner

*Primary Examiner* — Kenneth A Bratland, Jr.
(74) *Attorney, Agent, or Firm* — Imperium Patent Works; Darien K. Wallace

(57) ABSTRACT

A single-crystal pulling device includes vertically tilted magnetic coils between the walls of a cooling vessel. The inside and outside walls of the cooling vessel are coaxially aligned about a central axis. The inside wall of the cooling vessel is coaxially disposed around a cylindrical crucible that holds molten semiconductor material. A mid line passes through the middle point of a first coil, the central axis and the middle point of a second coil. The first coil is wound in a first plane, and the second coil is wound in a second plane. The first plane and the second plane both intersect the central axis at the same point. The first plane intersects the central axis at an angle between 5 and 15 degrees. In one embodiment, the first plane intersects the central axis below the crucible. In another embodiment, the first plane intersects the central axis above the crucible.

22 Claims, 15 Drawing Sheets

GENERATING A HOMOGENEOUS MAGNETIC FIELD WHILE PULLING A SINGLE CRYSTAL FROM MOLTEN SEMICONDUCTOR MATERIAL

TECHNICAL FIELD

The present invention relates to a single-crystal pulling method and, more particularly, to a method of generating a homogeneous magnetic field through molten semiconductor material from which the single crystal is formed.

BACKGROUND INFORMATION

Integrated circuits are typically made from wafers of semiconductor material, such a silicon, germanium or gallium arsenide. The wafers are cut from cylindrical ingots, also called boules, of a single crystal of the semiconductor material. One method of making the single-crystal ingots is the Czochralski process of crystal growth that involves rotating a growing crystal that is pulled up from a "melt" of molten semiconductor material.

FIG. 1 (prior art) illustrates a single-crystal pulling device 10 used to perform a modified Czochralski process of pulling a single-crystal ingot. The ingot is made in a furnace 11 that includes a crucible 12 surrounded by a heater 13. A high-purity semiconductor material 14 is melted in crucible 12, which is typically made of quartz. A seed crystal is suspended from a rod and is dipped into the molten semiconductor material 14. As the semiconductor material crystallizes around the seed crystal, the rod is slowly pulled upward and is rotated around a vertical axis 15. Crucible 12 is rotated about vertical axis 15 in the opposite direction. A cylindrical, single-crystal ingot 16 is pulled from the melt.

The heating of the semiconductor material in the molten state causes convection currents 17 in crucible 12. The convection currents cause different areas of the molten semiconductor material below a crystallization disk 18 to have different temperatures. Molten semiconductor material at different temperatures crystallizes at different rates, resulting in defects in the crystal lattice structure of the semiconductor. For example, a large temperature gradient on crystallization disk 18 can cause both vacancies and interstitials in the crystal lattice structure, which result in lower quality wafers. By controlling the rate at which the crucible rotates and the rate at which the ingot is pulled up and rotated in the opposite direction, the temperature gradient is homogenized over the entire crystallization disk 18. By homogenizing the temperature gradient and thus the speed of crystallization, the profile of the crystallization interface between molten semiconductor material 14 and single-crystal ingot 16 is maintained as a smooth surface, and the crystal lattice structure is more uniform and free of defects. A consequence of rotating the growing single-crystal ingot is that ingot 16 assumes a cylindrical shape. Ingot 16 is then cut into wafers with a diamond saw and further polished to yield the semiconductor starting material for making integrated circuits.

The defects in the single crystal can be further reduced by suppressing the convection flows in the melt even more by using magnetic fields. FIG. 1 shows a cooling vessel 19 with a double-cylinder structure that houses two magnetic coils between inner and outer cylindrical walls. A first magnetic coil 20 is positioned opposite a second magnetic coil 21 with respect to vertical axis 15. The planes of both magnetic coils 20-21 are parallel to each other and to vertical axis 15. In addition to the rotation of crucible 12 and ingot 15 that homogenizes the temperature gradient of the molten semiconductor material 14, the magnetic fields generated by magnetic coils 20-21 suppress the movement of the convective flows and thereby further homogenize the temperature gradient of the molten semiconductor material 14 near crystallization disk 18.

FIG. 2 (prior art) shows the magnetic field lines 22 of the magnetic field generated between magnetic coils 20-21. Each field line represents the locations in the cross-sectional area between magnetic coils 20-21 that have the same magnetic flux density. FIG. 2 shows that there is a X-shaped cross section 23 of the magnetic field inside the crucible. Magnetic coils 20-21 homogenize the convective flows mainly by stirring them rather than by suppressing their flow. The stationary X-shaped field 23 crosses the convection currents in the rotating crucible 12 and stirs them.

FIG. 3 (prior art) shows a three-dimensional perspective view of one surface of equal flux density of a more uniform magnetic field 24 that can be generated by using four instead of two magnetic coils. Each pair of opposing coils is a Helmholtz pair oriented parallel to one another. FIG. 3 shows that only a small portion of the equal-flux surface of magnetic field 24 is close to being parallel to the crystallization plane, which is perpendicular to the z axis. Thus, rotating a crucible of molten semiconductor material within the magnetic field 24 depicted in FIG. 3 would tend to homogenize the convective flows by stirring them rather than by suppressing their flow. The molten semiconductor material immediately below the crystallization plane would be stirred as the molten semiconductor material rotating about the z axis crosses magnetic flux lines that are not parallel to the xy plane.

FIG. 4 (prior art) shows another single-crystal pulling device 25 as disclosed in U.S. Pat. No. 6,984,264. Pulling device 25 has four planar magnetic coils 26-29 that generate an even more uniform magnetic field than the field in FIG. 3. Each pair of opposing coils 26-27 and 28-29 are also Helmholtz coils oriented parallel to one another. But by positioning opposing pairs of magnets other than perpendicular to one another, pulling device 25 generates a more balanced and gradually varying magnetic field than the field of FIG. 3 or the X-shaped field of FIG. 2. For example, the angle between magnets 26 and 28 and between magnets 27 and 29 is 113 degrees.

But although pulling device 25 generates a larger area of uniform magnetic flux than the fields of FIGS. 2-3, the magnetic field generated by pulling device 25 is still not uniform enough in the plane of the crystallization disk between the ingot and the molten semiconductor material. The surfaces of equal flux density still fall sharply from the coils towards the middle. The flux lines shown in FIG. 4 represent a cross section in the xy plane of the magnetic field at a z coordinate of zero. FIG. 4 shows that only a small portion of the equal-flux surface of the magnetic field is parallel to the crystallization plane, which is perpendicular to the z axis. Thus, rotating a crucible of molten semiconductor material within the magnetic field depicted in FIG. 4 would tend to homogenize the convective flows by stirring them rather than by suppressing their flow. The molten semiconductor material immediately below the crystallization plane would be stirred as the molten semiconductor material rotating about the z axis crosses those magnetic flux lines that are not parallel to the xy plane.

A design for a pulling device is sought that can better suppress the convective flows of molten semiconductor material by generating a strong and more uniform magnetic field that is closer to being parallel to the crystallization plane between the molten semiconductor material and the ingot being pulled from the melt.

SUMMARY

A single-crystal pulling device includes vertically tilted magnetic coils between the walls of a cooling vessel. The inside and outside walls of the cooling vessel are coaxially aligned about a central axis. The inside wall of the cooling vessel is coaxially disposed around a cylindrical crucible that holds molten semiconductor material from which a single-crystal ingot is pulled. A first magnetic coil is wound in a first plane, and a second magnetic coil is wound in a second plane. The first magnetic coil has a first middle point, and the second magnetic coil has a second middle point. A mid line passes through the first middle point, the central axis and the second middle point. The first plane and the second plane both intersect the central axis at the same point. The first plane intersects the central axis at an angle with a range between 5 and 15 degrees. In one embodiment, the first and second planes intersect the central axis below the crucible. In another embodiment, the planes intersect the central axis above the crucible.

The single-crystal pulling device also includes third and fourth magnetic coils. The third magnetic coil is disposed opposite the fourth magnetic coil with respect to the central axis and within the cooling vessel between the inside wall and the outside wall. Thus, the coils are arranged counter clockwise around the central axis in the order first, third, second and fourth. The planes of the third and fourth magnetic coils also intersect the central axis at the point at an angle between 5 and 15 degrees. The central axis is the z axis, and an xy plane is perpendicular to the central axis. The first plane intersects the xy plane at a first intersect line, and the third plane intersects the xy plane at a second intersect line. The first intersect line intersects the second intersect line at an angle greater than 135 degrees.

In another embodiment, a single-crystal pulling device includes a cylindrical crucible, a cooling vessel and magnetic coils. An inside wall of the cooling vessel is coaxially disposed around the cylindrical crucible. A first magnetic coil loops in a first plane, and a second magnetic coil loops in a second plane. The first magnetic coil is disposed opposite the second magnetic coil with respect to a central axis and within the cooling vessel between the inside wall and an outside wall of the cooling vessel. The first plane intersects the central axis at a first angle with a range between 5 and 15 degrees. The second plane intersects the central axis at a second angle that equals the first angle. The first and second magnetic coils have the same diameter. An upper surface of molten semiconductor material is present in the cylindrical crucible. The cylindrical crucible is located such that the upper surface of the molten semiconductor material is between 20% and 30% of the diameter of the first magnetic coil lower than the highest point of the first magnetic coil.

The single-crystal pulling device also includes third and fourth magnetic coils that are disposed opposite one another with respect to the central axis and within the cooling vessel between the inside wall and the outside wall. The third magnetic coil loops in a third plane, and a fourth magnetic coil loops in a fourth plane. Each of the first plane, the second plane, the third plane and the fourth plane intersects the central axis at the same point. An xy plane that is perpendicular to the central axis intersects the first plane at a first intersect line. The xy plane intersects the third plane at a second intersect line. The first intersect line intersects the second intersect line at an angle greater than 135 degrees.

A method of making a single-crystal ingot uses vertically tilted magnetic coils. A single crystal of semiconductor material is pulled from molten semiconductor material in a cylindrical crucible. A first magnetic coil is disposed opposite a second magnetic coil with respect to a central axis and between the coaxial inside and outside walls of a cooling vessel. The first magnetic coil has a first middle point, and the second magnetic coil has a second middle point. A mid line passes through the first middle point, the central axis and the second middle point. The inside wall of the cooling vessel is coaxially disposed around the cylindrical crucible.

As the single-crystal ingot is being pulled, a magnetic field is generated through the molten semiconductor material so as to suppress convection flows within the molten semiconductor material. The magnetic field is generated using the first and second magnetic coils. The first magnetic coil is wound in a first plane, and the second magnetic coil is wound in a second plane. The first plane intersects the central axis at a first angle with a range between 5 and 15 degrees.

The first and second coils have the same diameter. An optimal field line passes through a first point on the first plane that is between 20% and 30% of the diameter of the first coil lower than the highest point of the first coil. The optimal field line also passes through a second point on the second plane that is between 20% and 30% of the diameter of the second coil lower than the highest point of the second coil. The cylindrical crucible is maintained at a height such that the optimal field line passes approximately through the upper surface of the molten semiconductor material.

In another embodiment, a single-crystal pulling device includes a crucible, a cooling vessel and a means for generating a magnetic field. The crucible is adapted to hold a molten semiconductor material. The cooling vessel is coaxially disposed around the crucible. The means generates a magnetic field that is at least 0.03 Tesla at some point along the central axis of the cooling vessel. The magnetic field is centered on the central axis and is not symmetrical both above and below any xy plane that is perpendicular to the central axis.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
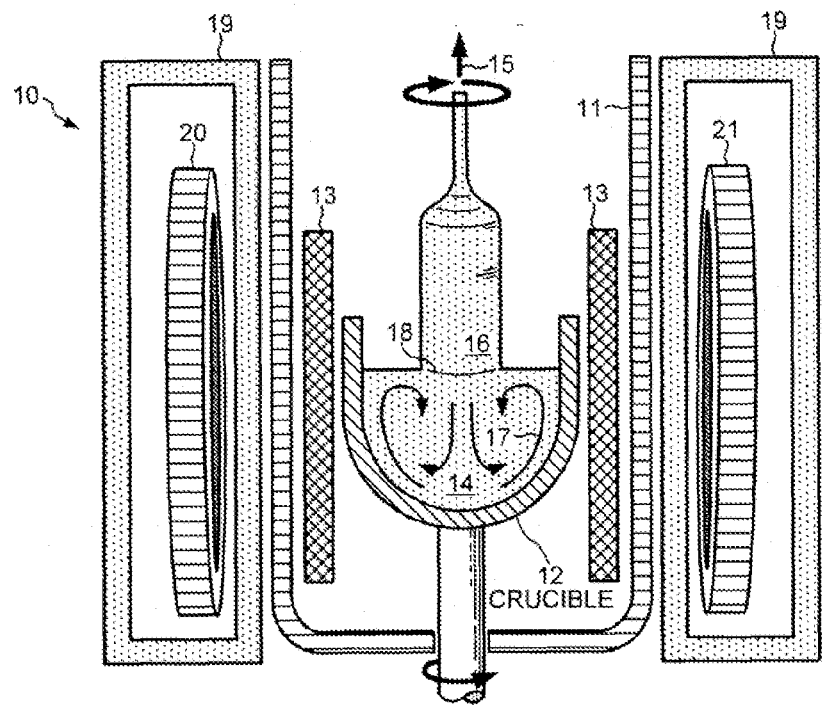
FIG. 1 (prior art) is a cross-sectional view of a single-crystal pulling device used to perform a modified Czochralski process of pulling a single-crystal ingot.
Figure 2:
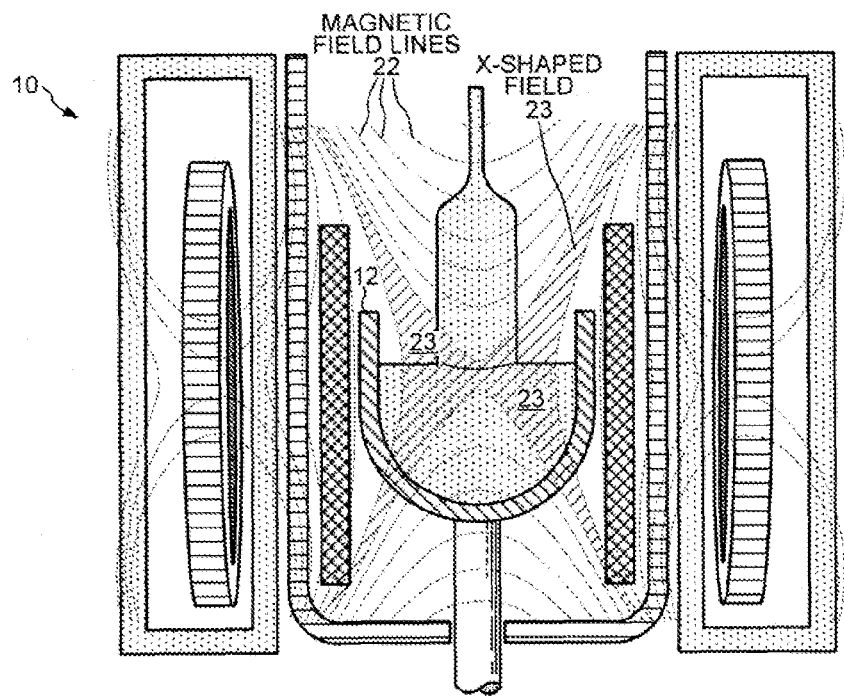
FIG. 2 (prior art) shows an X-shaped magnetic field generated between the parallel coils of FIG. 1.
Figure 3:
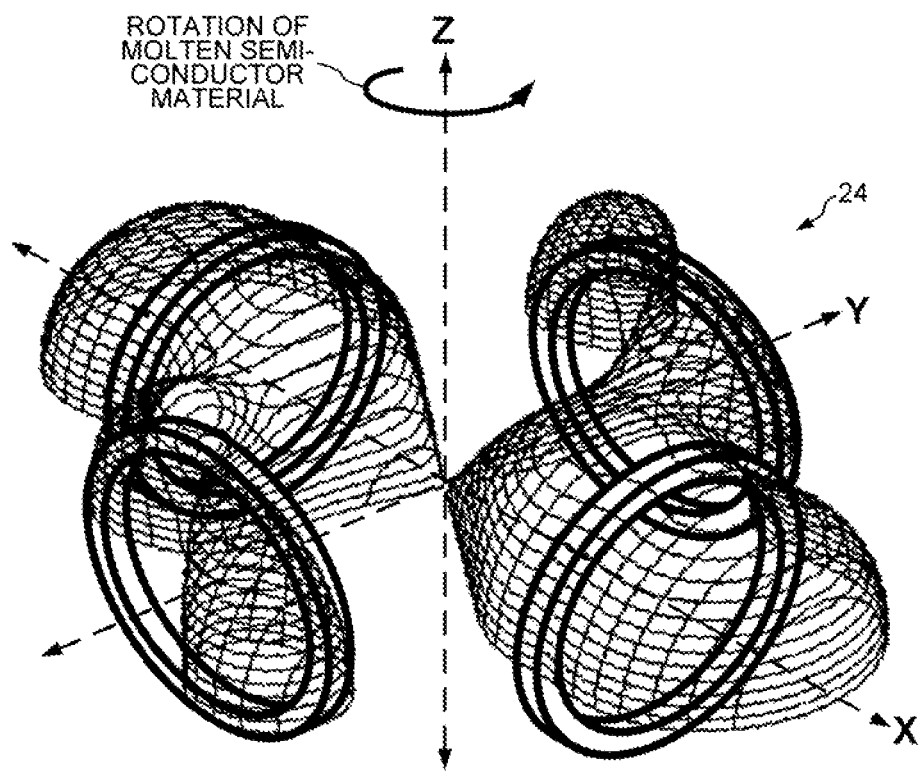
FIG. 3 (prior art) shows a three-dimensional perspective view of a surface of equal flux density of a magnetic field generated between two perpendicular pairs of parallel coils.
Figure 4:
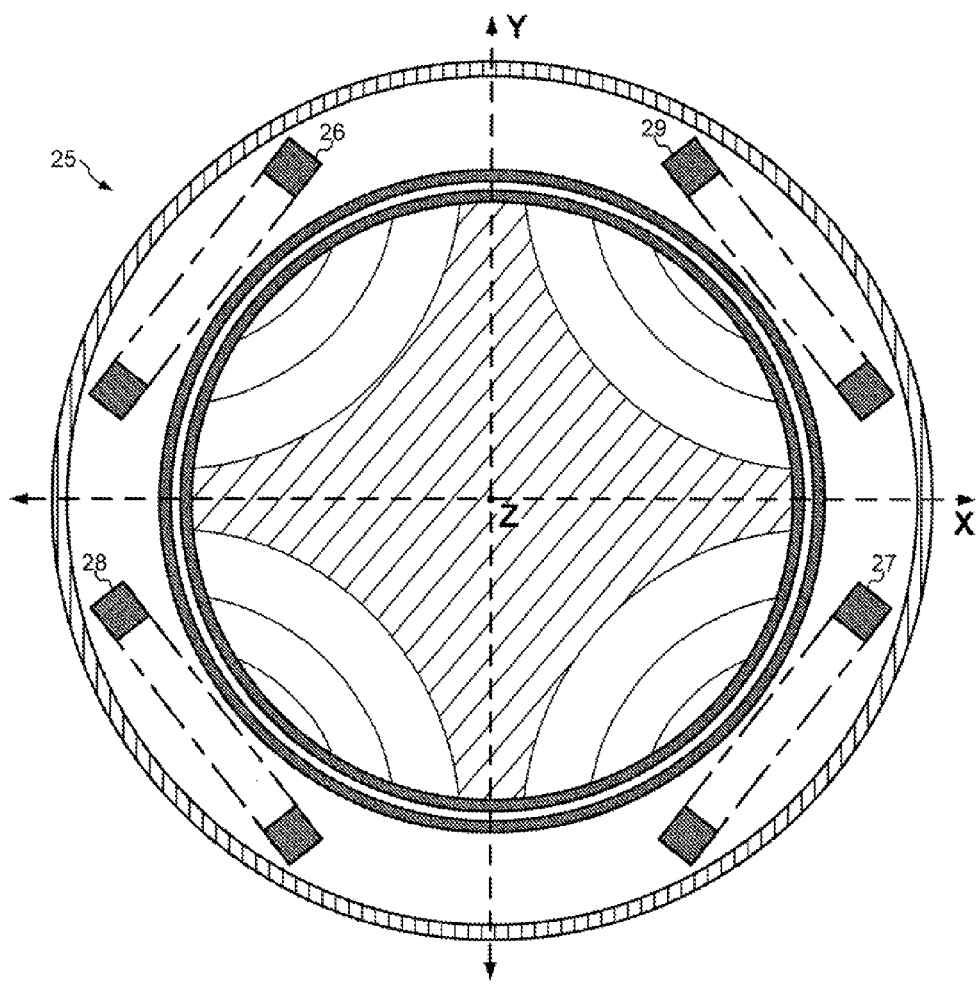
FIG. 4 (prior art) is a top-down cross sectional view of the magnetic field generated by another single-crystal pulling device with two pair of opposing parallel Helmholtz coils that are not perpendicular to one another.
Figure 5:
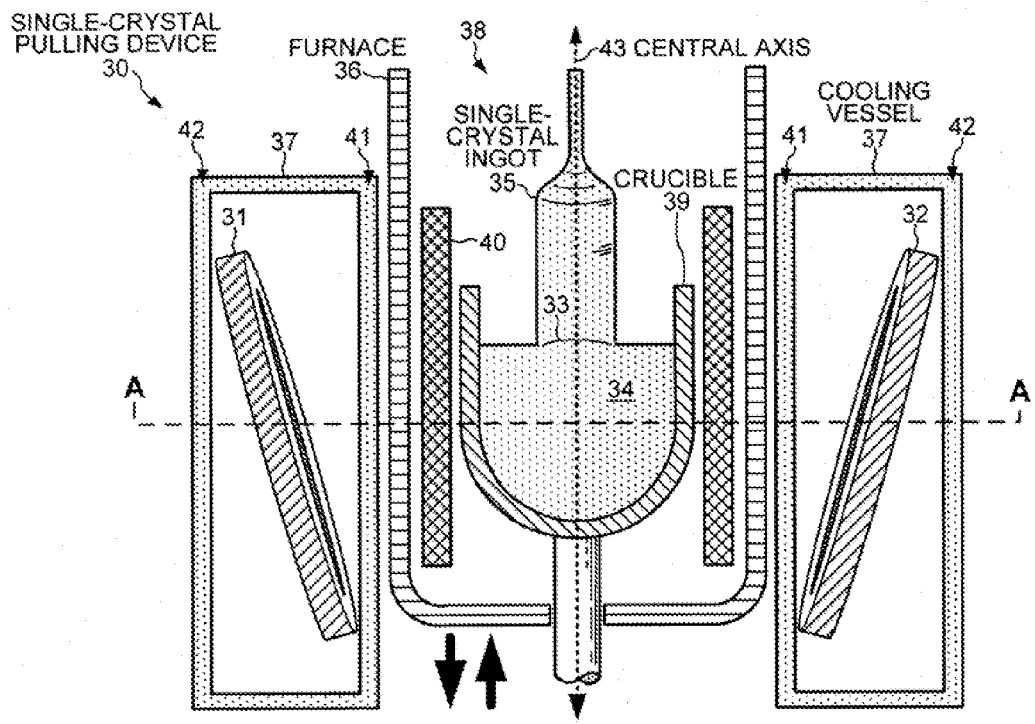
FIG. 5 is a cross-sectional side view of a single-crystal pulling device with tilted magnetic coils that generates a magnetic field that is more nearly parallel to the crystallization surface between the molten semiconductor material and the ingot being pulled from the melt.

FIG. 5 is a cross-sectional side view of a single-crystal pulling device 30 with tilted magnetic coils 31-32 that generates a magnetic field that is more nearly parallel to the crystallization surface 33 between the molten semiconductor material 34 and the ingot 35 being pulled from the melt. (Coils 31-32 are illustrated in perspective as opposed to as cross sections.) Pulling device 30 includes a furnace 36 surrounded by a cooling vessel 37. Furnace 36 has a closable upper opening to an inner cylindrical cavity 38. A cylindrical crucible 39 surrounded by an electric heating element 40 is centered in the cylindrical furnace cavity 38. Crucible 39 rests on a shaft that can be rotated. During operation, a semiconductor material is melted in crucible 39. For example, a single crystal can be made of semiconductor material such as silicon, germanium or gallium arsenide. Crucible 39 can be made of quartz, tungsten or platinum, all of which have higher melting points than silicon. Inner cylindrical cavity 38 may be sealed off and filled with an atmosphere of inert gas, such as helium or argon, in order to prevent impurities such as oxygen from being incorporated into the crystal lattice structure of the single crystal. Alternatively, a partial vacuum can be created within cavity 38, such as down to tens of Torr.

The magnetic coils 31-32 are superconducting and must be kept at a very low operating temperature. The coils can be kept cold by immersing them in a coolant (bath cooling) or by conduction cooling by a cryocooler. Cooling vessel 37 has a double-cylinder structure with an inside wall 41 and an outside wall 42. In one embodiment, cooling vessel 37 provides bath cooling. Cooling vessel 37 is enclosed on the top and bottom and filled with a coolant, such as liquid helium or nitrogen. All of outside wall 42, inside wall 41, furnace 36, heating element 40 and cylindrical crucible 39 are coaxially centered about a central axis 43. Thus, inside wall 41 of cooling vessel 37 is coaxially disposed around cylindrical crucible 39. Inside wall 41 is protected from the outer wall of furnace 36 by a cold shield (not shown in FIG. 5). In some embodiments, cooling vessel 38 has multiple chambers. For example, the inner chamber enclosed by inside wall 41 and outside wall 42 can be enclosed on all sides by an outer vacuum chamber, such as a cryostat. Where the inner chamber is filled with liquid helium, the outer cryostat insulates the inner chamber and allows the helium to remain in a liquid state. The inner chamber is separated from the outer walls of the cryostat by one or more cooling and/or heat radiation shields that maintain decreasing intermediate temperatures. The outer chamber is not shown in the FIG. 5. In another embodiment, cooling vessel 37 is not filled with a coolant but is rather attached to a cryocooler that provides conduction cooling. A "cold finger" of the cryocooler extends into the cooling vessel and cools the magnetic coils 31-32.

In the embodiment of FIG. 5, each of first magnetic coil 31 and second magnetic coil 32 is circular in shape. In other embodiments, magnets 31-32 have an elliptical, rectangular or racetrack shape. In the embodiment of FIG. 5, the magnetic coils are planar and do not wrap around inside wall 41. The individual wires (strands) that make up the coils can have various cross sections, such as round, rectangular or a flat tape. Many strands may be wrapped to make a cable coil, or a single superconducting strand may be used. The superconducting wires are made of superconducting materials, such as metallic alloys and compounds such as (Niobium-Titanium (NbTi), Niobium3Tin (Nb3Sn), or Niobium3Aluminum (Nb3Al)), other metal-containing materials (Magnesium Diboride(MgB2)), ceramics (Bismuth Strontium Calcium Copper Oxide (BiSCCO) and Yttrium Barium Copper Oxide (YBCO)), or rare-earth-based ceramics (ReBCO). These superconducting wires can be embedded as layers or in matrices of strands in the cross section of the cable that makes up the coil. At least one of the other materials of the layers or in the matrix is metallic, such as copper, silver, stainless steel or other metal alloys. For example, an individual wire can have a copper core, surrounded by a radial matrix of superconducting wires, all of which are surrounded by a copper or silver sheath. The entire furnace 36 including crucible 39 can be raised and lowered with respect to cooling vessel 37 so as to keep the upper surface of the molten semiconductor material 34 at a desired level with respect to the magnetic coils 31-32.

Figure 6:
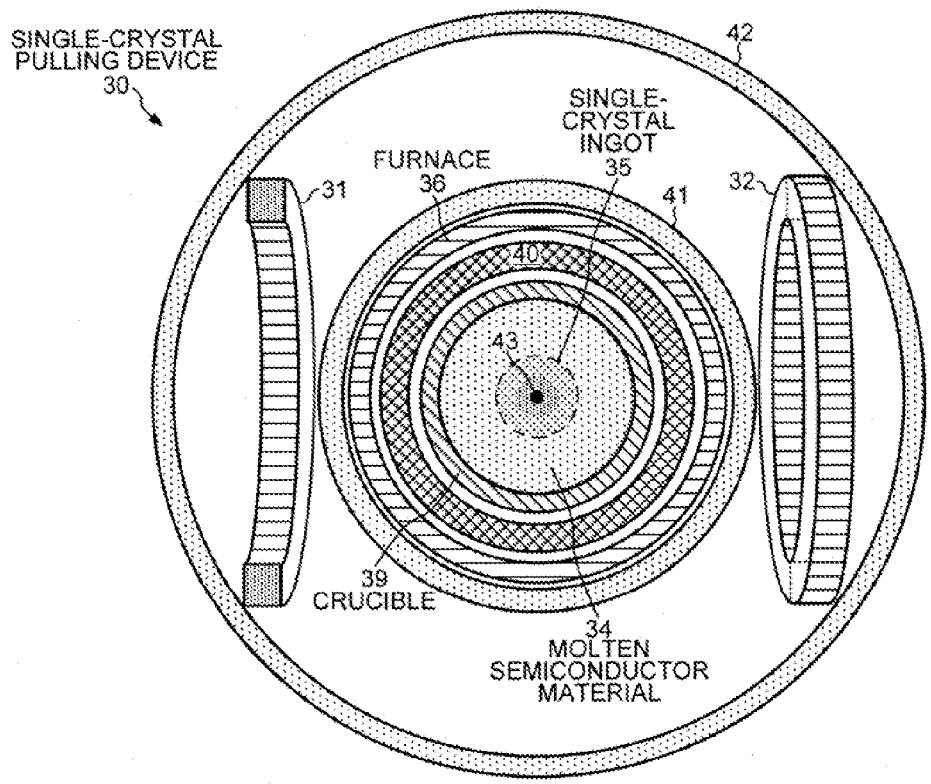
FIG. 6 is a cross-sectional top-down view of the pulling device of FIG. 5 with perspective views of the tilted magnetic coils.

FIG. 6 is a cross-sectional top-down view of pulling device 30 through plane A-A of FIG. 5. FIG. 6 also shows a perspective view of first magnetic coil 31 below plane A-A, as well as a complete perspective view of second magnetic coil 32. A dashed line shows the location of single-crystal ingot 35 above plane A-A. FIG. 6 shows that first magnetic coil 31 is disposed opposite second magnetic coil 32 with respect to central axis 43. Silicon wafers currently being used in the semiconductor industry have a diameter of 300 mm (about 12 inches). The size of silicon wafers has gradually increased over time so as to improve throughput and reduce cost. The larger the diameter, the less surface area near the round edge of the wafer is wasted where a rectangular chip cannot be accommodated. Wafer fabs are currently being constructed to make wafers with diameters of 450 mm (about 18 inches). Thus, cylindrical crucible 39 must have a diameter that is larger than that of ingot 35 from which the wafers are cut. Therefore, magnetic coils 31-32 should be at least forty centimeters apart. And in order to generate a magnetic field between the magnets 31-32 that is sufficiently strong throughout the contents of crucible 39, magnetic coils 31-32 should have diameters of at least forty centimeters. The diameters of magnetic coils 31-32 are the same. The magnetic coils are typically connected in series, but they may also be powered separately or in groups.

Figure 7:
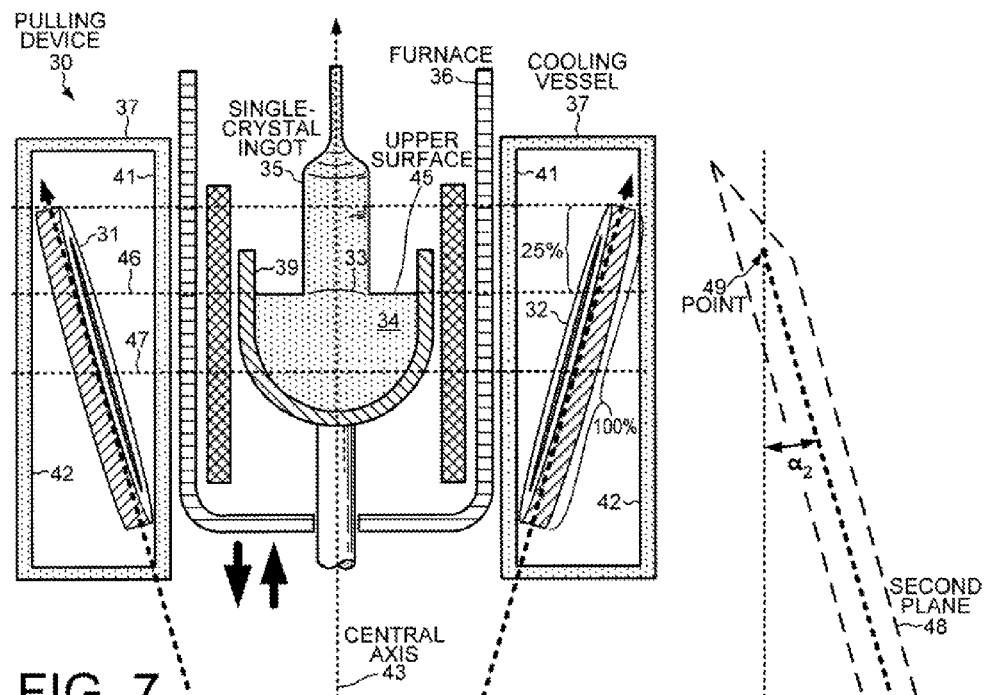
FIG. 7 is a cross-sectional side view of the pulling device of FIG. 5 showing the magnetic coils tilted open upwards.

FIG. 7 is a cross-sectional side view of single-crystal pulling device 30 showing how magnetic coils 31-32 are tilted in a first embodiment. Both magnetic coils 31-32 are disposed within cooling vessel 37 between inside wall 41 and outside wall 42. First magnetic coil 31 loops in a first plane that intersects central axis 43 at a first angle $\alpha_1$. First angle $\alpha_1$ falls within a range between 5 and 15 degrees. The first plane intersects central axis 43 at a point 44 below cylindrical crucible 39. Second magnetic coil 32 is positioned symmetrically to first magnetic coil 31 on the opposite side of central axis 43. Second magnetic coil 32 loops in a second plane that intersects central axis 43 at a second angle $\alpha 2$. Second angle $\alpha 2$ equals first angle $\alpha 1$, so second angle $\alpha 2$ also falls within a range of 5 to 15 degrees. The second plane also intersects central axis 43 at point 44 below cylindrical crucible 39.

Molten semiconductor material 34 has an upper surface 45 that descends within crucible 39 as semiconductor material is pulled out of the melt with ingot 35. In the first embodiment shown in FIG. 7, the height of furnace 36 (or at least crucible 39) is adjusted such that upper surface 45 remains between 20% and 30% of the distance from the top of the coils 31-32. FIG. 7 shows an optimal field line 46 that passes through both coils 31-32 at points that are lower than the highest points on the coils by 25% of the coil diameter. Thus, cylindrical crucible 39 is maintained at a height such that optimal field line 46 passes approximately through upper surface 45 of molten semiconductor material 34. A mid line 47 passes through the middle of first magnetic coil 31, through central axis 43 and through the middle of second magnetic coil 32. Optimal field line 46 is parallel to mid line 47.

Figure 8:
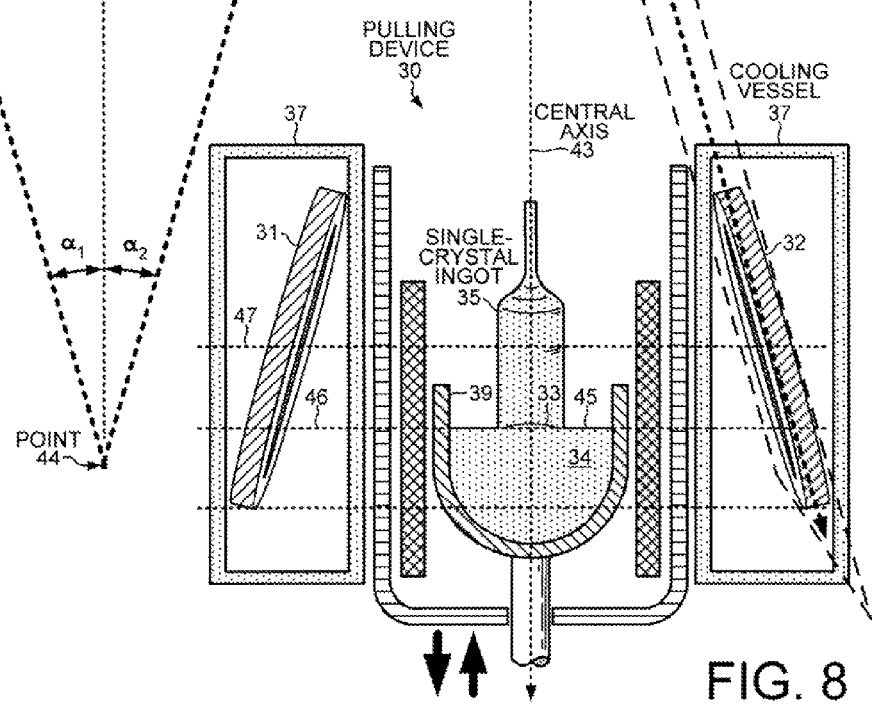
FIG. 8 is a cross-sectional side view of the pulling device of FIG. 5 showing the magnetic coils tilted open downwards.

FIG. 8 is a cross-sectional side view of pulling device 30 showing how magnetic coils 31-32 are tilted in a second embodiment. Again, first magnetic coil 31 is positioned symmetrically to second magnetic coil 32 on the opposite side of central axis 43. Similar to the first embodiment, the first plane of first magnetic coil 31 and the second plane 48 of second magnetic coil 32 both intersect central axis 43 at the same point 49. And the angle at which both the first plane and the second plane 48 intersect central axis 43 is the same and falls within a range between 5 and 15 degrees. However, the point 49 at which the first and second planes intersect central axis 43 is above cylindrical crucible 39. Thus, in the first embodiment shown in FIG. 7, coils 31-32 tilt open at the top, whereas coils 31-32 tilt open to the bottom in the second embodiment shown in FIG. 8.

In the second embodiment shown in FIG. 8, the height of crucible 39 is adjusted such that upper surface 45 of molten semiconductor material 34 remains between 20% and 30% of the distance from the bottom of the coils 31-32. In FIG. 8, optimal field line 46 that passes through coils 31-32 at points that are above the lowest points on the coils by 25% of the coil diameter. Thus, cylindrical crucible 39 is maintained at a height such that optimal field line 46 passes approximately through upper surface 45 of molten semiconductor material 34.

Figure 9:
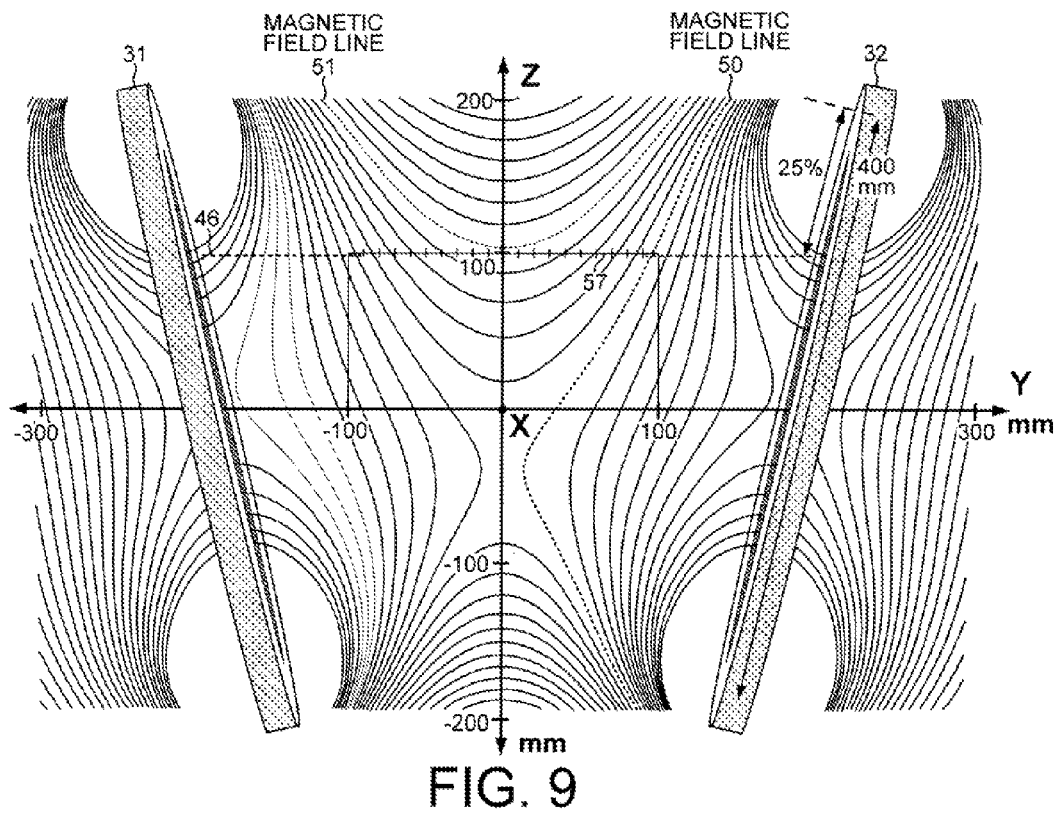
FIG. 9 is a plot of the magnetic field lines passing between the coils of the pulling device of FIG. 5 which are tilted open at the top by ten degrees from vertical.

FIG. 9 shows the magnetic field lines passing between first magnetic coil 31 and second magnetic coil 32 that are each tilted open at the top by ten degrees from vertical. In FIG. 9, the z axis is the central axis 43 about which the coils 31-32 are symmetrically positioned. Thus, the angle at which both the first plane of coil 31 and the second plane of coil 32 intersect the z axis is ten degrees. Each of the coils 31-32 has a diameter of 400 millimeters measured between the center of the wires on opposite sides of the loop. The centers of magnets 31-32 are spaced 400 millimeters apart. Each coil generates a maximum magnetic flux density of about one Tesla. The dimensions of the pulling device with the tilted coils 31-32 shown in FIG. 9 have the smallest scale that would be commercially viable for making silicon ingots. Most commercial embodiments would have coils with diameters of more than one meter that produce a large magnetic flux density on the coil conductor of about six Tesla. Pulling system 30 includes means to dampen the magnetic field outside of cooling vessel 38. A shielding layer of ferromagnetic material, such as iron, is placed on all sides of cooling vessel 38, except on inside wall 31 facing crucible 39. The shielding layer can be placed on the inside surface or on the outside surface of outside wall 42.

In FIG. 9, the lines representing magnetic flux density indicate that the magnetic flux decreases rapidly with distance from the coils. For example, dashed magnetic field line 50, which passes near the xyz coordinate (0, 100, 100), indicates a magnetic flux density of about 0.051 Tesla. And the dashed magnetic field line 51, which passes near the xyz coordinate (0, 0, 100), indicates a magnetic flux density of about 0.038 Tesla. When the coils are tilted, the magnetic field lines form a deeper trough between the coils at the bottom. But the gradient of the magnetic field where the coils tilt open at the top is flattened. Thus, a relatively large field strength of 0.038 Tesla is maintained at the relatively flat magnetic field lines 100 millimeters above the central point about which the magnetic coils are centered. The convective flows of molten semiconductor material 34 can be better suppressed as opposed to stirred by placing a flatter but yet strong magnetic field at upper surface 45 where molten semiconductor material 34 crystallizes onto the bottom of single-crystal ingot 35. Although the gradient of the magnetic field is flatter at larger z coordinates between the coils 31-32, the magnetic field strength decreases to such an extent above the tops of the coils 31-32 that any suppression of the convective flows is drastically reduced. Thus, the tilted coils 31-32 are a means for generating a magnetic field centered on the central axis that is not symmetrical above and below any xy plane that is perpendicular to the central axis, but yet that maintains a relatively strong magnetic field (e.g., at least 0.03 Tesla for a magnetic flux of one Tesla on the conductors) at some point along the central axis where the field lines are relatively flat.

For a tilting angle $\alpha$ between five and fifteen degrees, the optimum tradeoff between maintaining a large field strength and achieving a flatter field gradient is obtained by placing upper surface 45 of molten semiconductor material 34 below the highest points of the coils 31-32 by between 20% and 30% of the coil diameter, respectively. Thus, for the tilting angle α of ten degrees, the optimum tradeoff between maintaining a large field strength and achieving a flatter field gradient is obtained by placing upper surface 45 of molten semiconductor material 34 about 25% of a coil diameter below the highest points of the coils 31-32. For the coil diameter of 400 millimeters in FIG. 9, the optimal field line 46 is placed 100 millimeters below the top of the 400-millimeter coils, which passes near the bottom of dashed magnetic field line 51.

Figure 10:
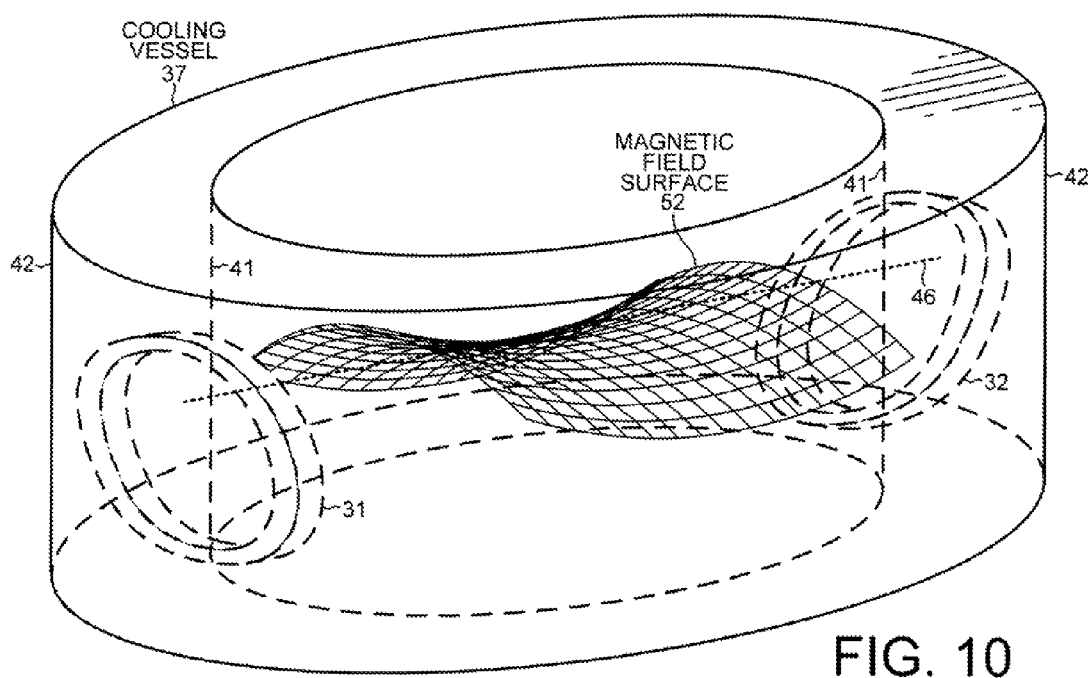
FIG. 10 is a perspective view of a three-dimensional surface of same magnetic flux density passing through an optimum field line between the coils of the pulling device of FIG. 5.

FIG. 10 is a perspective view of a three-dimensional surface 52 of the same magnetic flux density passing through the optimum field line 46 between first magnetic coil 31 and second magnetic coil 32. By tilting the coils 31-32, the lines representing magnetic flux density are flattened where the coils tilt open at the top to form a shallower saddle 52 over the optimum field line 46. Compared to the deeper trough between parallel coils, the shallower saddle 52 between tilted coils 31-32 better suppresses the convective flows because the magnetic field is closer to being parallel to the crystallization plane between molten semiconductor material 34 and ingot 35. FIG. 10 also illustrates the space constraints of the cryostat or cooling vessel 37. Because of the limited width between inside wall 41 and outside wall 42, for a large diameter coil it might not be possible to tilt the coils sufficiently to achieve the optimum flatness and strength of the magnetic field. Thus, the dimensions of cooling vessel 37 may require that the coils 31-32 be tilted less than the optimum amount.

Figure 11:
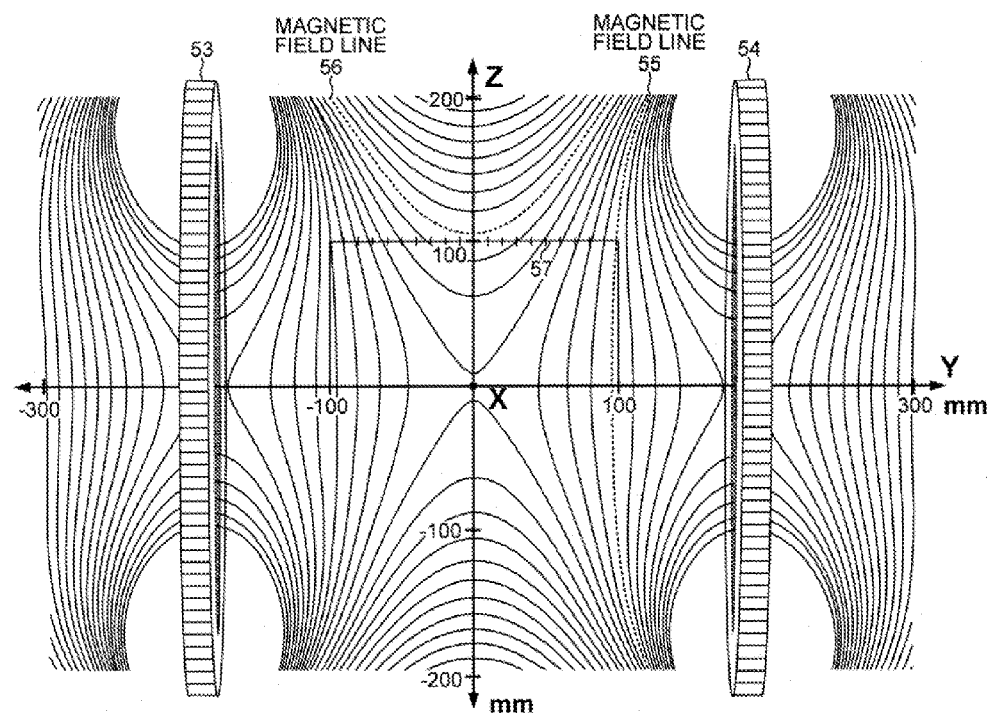
FIG. 11 is a plot of the magnetic field lines passing between two parallel magnetic coils in a Helmholtz configuration.

FIG. 11 shows the magnetic field lines passing between two parallel magnetic coils 53-54 in a Helmholtz configuration. As with coils 31-32, each of coils 53-54 also has a diameter of 400 millimeters, and the centers of coils 53-54 are also spaced 400 millimeters apart. Each of coils 53-54 also generates a maximum magnetic flux density of about one Tesla. In FIG. 11, dashed magnetic field line 55, which passes near the xyz coordinate (0, 100, 100), indicates a magnetic flux density of about 0.0587 Tesla. And the dashed magnetic field line 56, which passes near the xyz coordinate (0, 0, 100), indicates a magnetic flux density of about 0.0418 Tesla. Compared to the shallower saddle 52 between tilted coils 31-32, the field line 56 in FIG. 11 that has roughly the same magnetic field strength as field line 51 in FIG. 9, indicates a deeper trough and a less flat magnetic field between coils 53-54. Thus, the surface of the magnetic field between coils 53-54 that has about the same magnetic flux density as that of surface 52 in FIG. 10 is not as flat.

Figure 12:
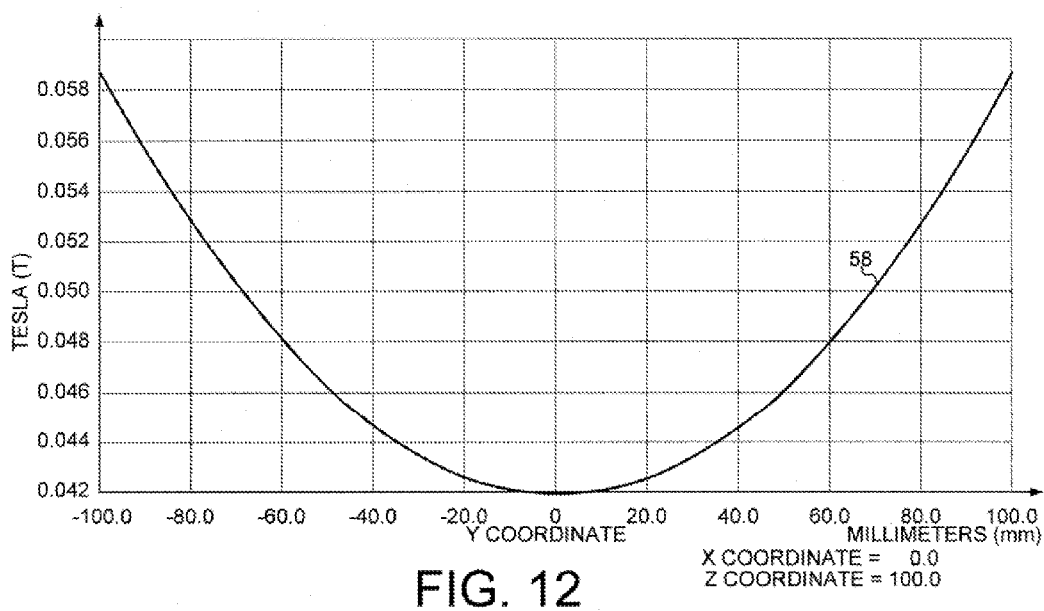
FIG. 12 is a diagram plotting the magnetic flux density through a cross section of the magnetic field between the parallel coils of FIG. 11.

FIG. 12 is a diagram plotting the magnetic flux density of a cross section 57 of the magnetic field between parallel coils 53-54 in FIG. 11 for y coordinates between −100.0 millimeters and +100.0 millimeters for an x coordinate of 0.0 and a z coordinate of 100.0 millimeters. The curve 58 shows that the magnetic flux density of cross section 57 varies from 0.0418 Tesla at the bottom of the trough at the coordinates (0, 0, 100) to 0.0587 Tesla at the edge of the trough at the coordinates (0, 100, 100). Thus, the magnetic field varies by 0.0169 Tesla over cross section 57.

Figure 13:
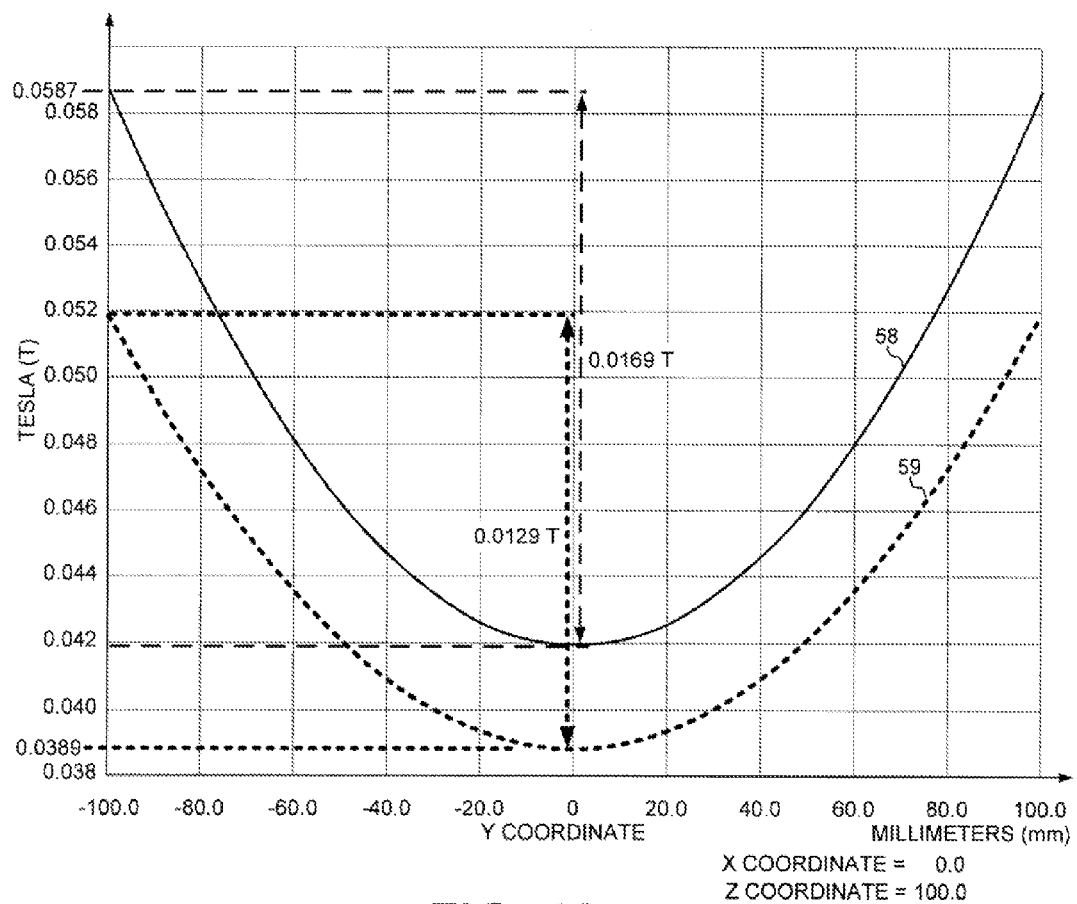
FIG. 13 is a diagram showing the variation in magnetic field strength through the cross section between the parallel coils of FIG. 11 compared to the variation in magnetic field strength through a cross section between the tilted coils of FIG. 9.

FIG. 13 is a diagram showing the variation in magnetic field strength over cross section 57 between the parallel coils 53-54 in FIG. 11 compared to the variation in magnetic field strength over cross section 57 between the tilted coils 31-32 in FIG. 9. The curve 59 represents the magnetic flux density at cross section 57 of the magnetic field between tilted coils 31-32 in FIG. 9 for y coordinates between −100.0 millimeters and +100.0 millimeters, for an x coordinate of 0.0 and for a z coordinate of 100.0 millimeters. Curve 59 shows that the magnetic flux density varies from 0.0389 Tesla at the bottom of the trough at the coordinates (0, 0, 100) to 0.0518 Tesla at the edge of the trough at the coordinates (0, 100, 100). Thus, the magnetic field between the tilted coils 31-32 varies by only 0.0129 Tesla over cross section 57 compared to the variation of 0.0169 Tesla between the parallel coils 53-54 for field lines with approximately the same magnetic field strength. The field strength over cross section 57 varies by only about 33% between the tilted coils 31-32, whereas the field strength over cross section 57 varies by about 40% between the parallel coils 53-54.

Figure 14:
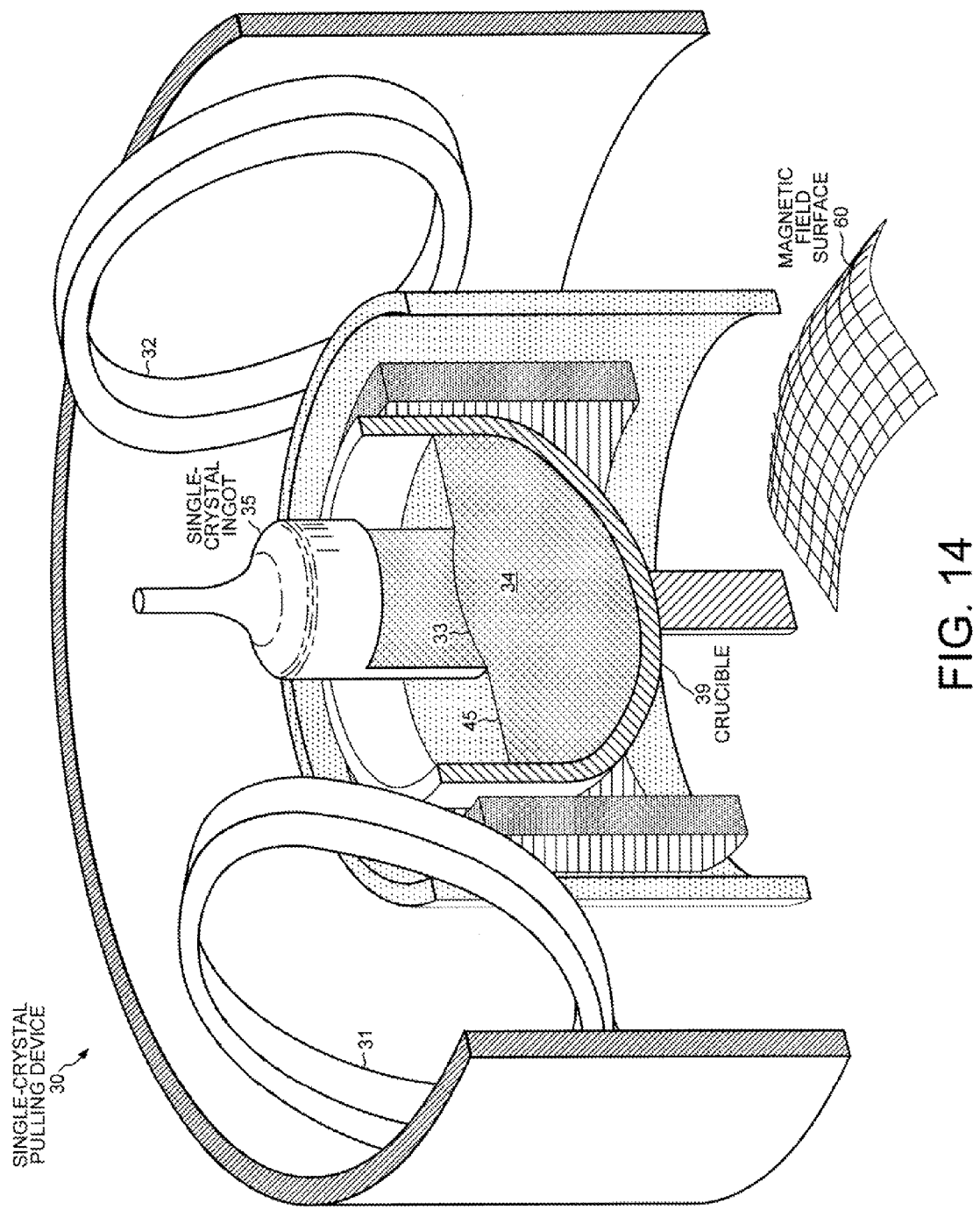
FIG. 14 is a cross-sectional perspective view of the single-crystal pulling device of FIG. 7 with a crystallization surface bowed upwards.

FIG. 14 is a cross-sectional perspective view of the first embodiment in FIG. 7 of single-crystal pulling device 30. FIG. 14 shows that crystallization surface 33 is not planar but rather bowed upwards. In the single-crystal pulling process, a small seed crystal that is attached to the end of a rod is first dipped into the melt. The conduction of heat up the seed crystal reduces the temperature of the molten semiconductor material 34 that is in contact with the seed crystal to slightly below the melting point of the semiconductor material 34. The molten semiconductor material 34 therefore freezes onto the end of the seed crystal. As the seed crystal is slowly pulled up out of the molten semiconductor material 34, the frozen material that has attached to the seed crystal become a crystallographic continuation of the seed crystal. Thus, the speed and manner of crystallization is primarily dependent upon temperature. Crystallization surface 33 bows upwards because the cooler temperature towards the sides of ingot 35 is where atoms of semiconductor material tend to crystallize first onto ingot 35.

Figure 15:
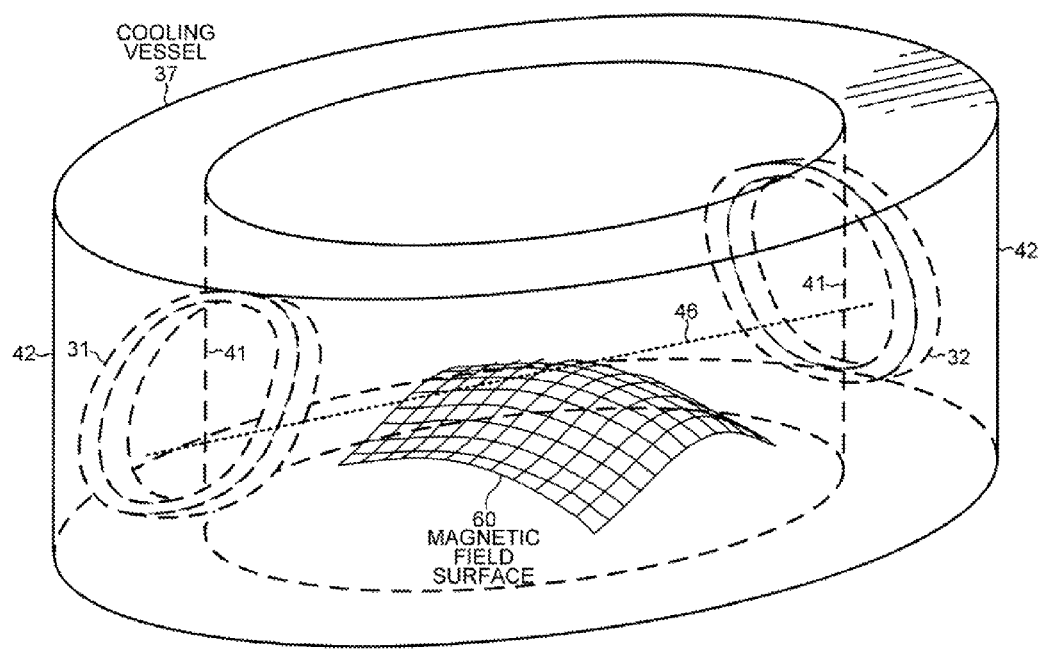
FIG. 15 shows a three-dimensional surface forming a low ridge of same magnetic flux density passing through the tilted coils of FIG. 8 that open downwards.

The shape of the magnetic field that is to suppress convective currents in the molten semiconductor material 34 can be made more closely to resemble the curvature of crystallization surface 33 by positioning the optimal field produced by the second embodiment of FIG. 8 just below crystallization surface 33. Whereas a magnetic field in the form of shallow saddle 52 is generated by the first embodiment of FIG. 7, a field in the form of a low ridge is formed by the second embodiment of FIG. 8. FIG. 15 illustrates a three-dimensional surface 60 of the same magnetic flux density passing through the optimum field line 46 between first magnetic coil 31 and second magnetic coil 32. By tilting the coils 31-32 open downwards, the lines representing equal magnetic flux density are flattened to form a low ridge 60 over the optimum field line 46. The low ridge 60 between tilted coils 31-32 better suppresses the convective flows because the magnetic field better matches crystallization surface 33 between molten semiconductor material 34 and ingot 35 and allows atoms to crystallize at the same rate all along the crystallization surface 33. FIG. 14 includes a separate image of magnetic field surface 60 from FIG. 15 to illustrate how surface 60 aligns with the curvature of crystallization surface 33. In operation, crucible 39 is adjusted up and down such that optimal magnetic field surface 60 is just below crystallization surface 33 of molten semiconductor material 34.

Figure 16:
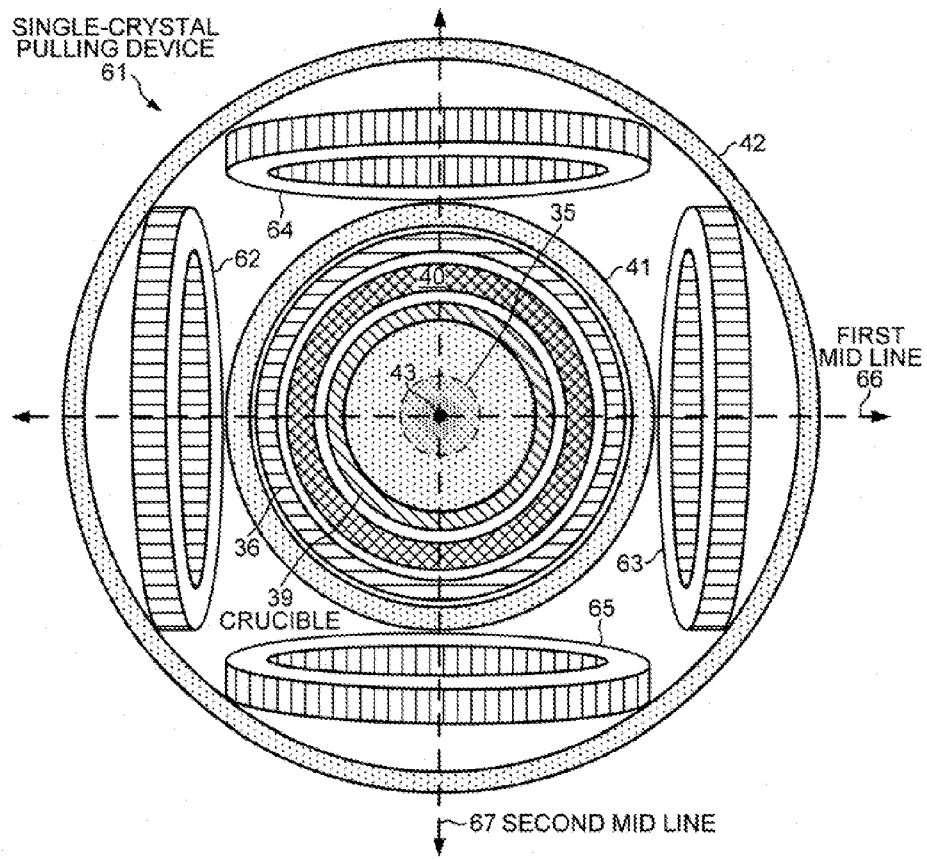
FIG. 16 is a cross-sectional top-down view of a single-crystal pulling device with four tilted magnetic coils that open upwards.

FIG. 16 is a cross-sectional top-down view of another single-crystal pulling device 61 with four tilted magnetic coils 62-65. The coils are shown in a complete perspective view instead of as cross sections. Each of coils 62-65 is circular in shape. Magnetic coil 62 is disposed opposite magnetic coil 63 with respect to central axis 43, and magnetic coil 64 is disposed opposite magnetic coil 65 with respect to central axis 43. The diameters of magnetic coils 62-65 are the same. The planes of each of the coils 62-65 intersect central axis 43 at the same point below cylindrical crucible 39. Thus, the planes of each of the coils 62-65 intersect central axis 43 at the same angle, which falls within a range between 5 and 15 degrees.

FIG. 16 shows a first mid line 66 that passes through the middle of magnetic coil 62, through central axis 43 and through the middle of magnetic coil 63. In addition, a second mid line 67 passes through the middle of magnetic coil 64, through central axis 43 and through the middle of magnetic coil 65. Thus, first mid line 66 intersects second mid line 67 at central axis 43. A first optimal field line (not shown) passes through both coils 62-63 at points that are lower than the highest points on the coils by 25% of the coil diameter. In addition, a second optimal field line (not shown) passes through both coils 64-65 at points that are lower than the highest points on the coils by 25% of the coil diameter. The first and second optimal field lines also intersect at central axis 43. The shape of the magnetic field whose lowest point falls at the intersection of the first and second optimal field lines is not the shallow saddle 52 that is between the two tilted magnets of FIG. 10 but rather a shallow depression.

Figure 17:
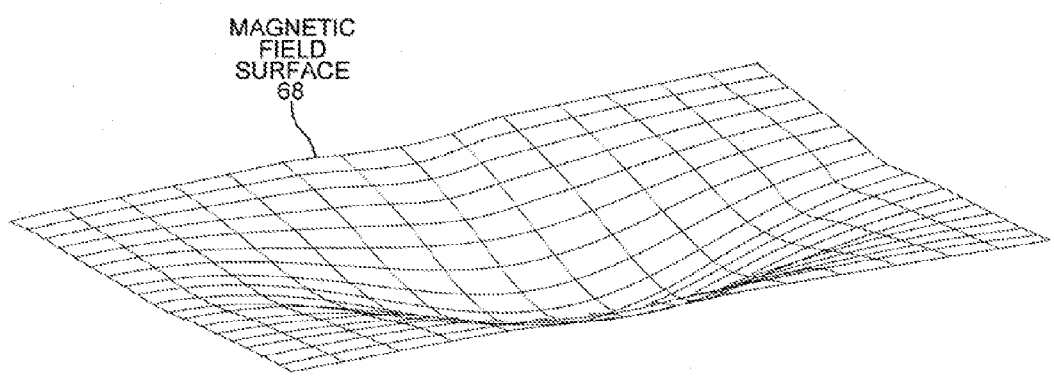
FIG. 17 is a perspective view of a three-dimensional surface of equal magnetic flux density forming a shallow depression between the four tilted coils of FIG. 16.

FIG. 17 is a perspective view of a three-dimensional surface 68 of equal magnetic flux density between the four tilted coils 62-65 whose lowest point falls at the intersection of the first and second optimal field lines. The magnetic field at surface 68 is flatter and more homogeneous than shallow saddle 52 of FIG. 10 because the depression on surface 68 is more nearly radially symmetric about central axis 43. As molten semiconductor material 34 rotates in crucible 39 about central axis 43, the magnetic field of surface 68 is more likely to suppress the convective flows of the semiconductor material than merely to stir them.

Figure 18:
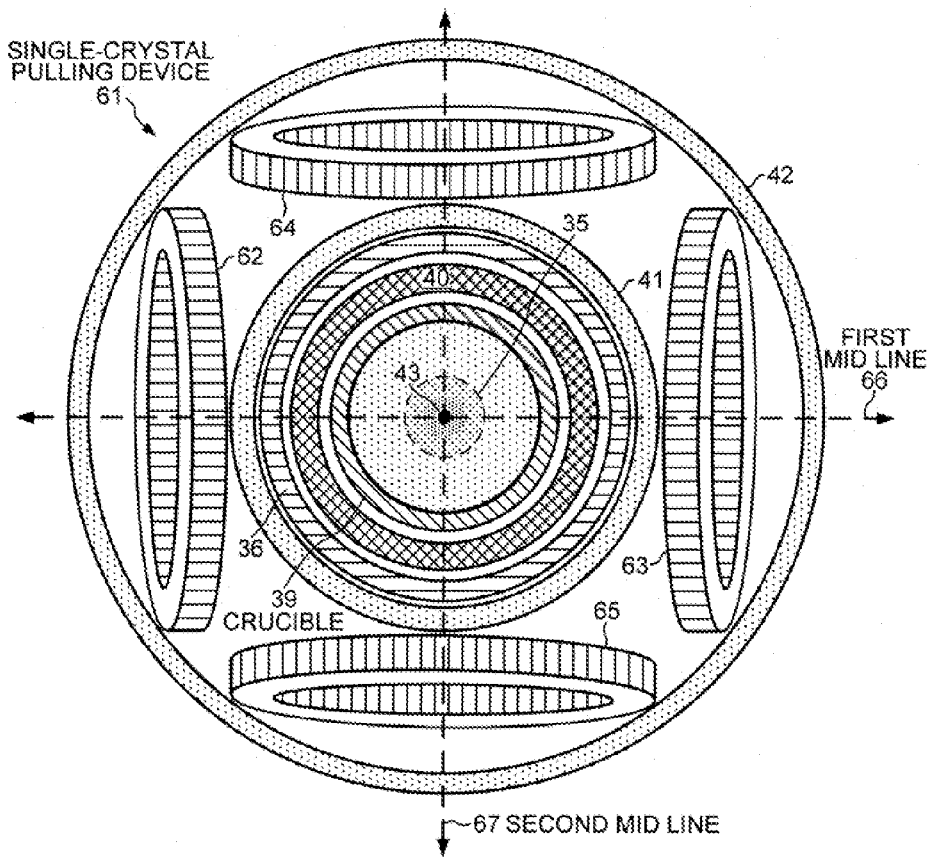
FIG. 18 is a cross-sectional top-down view of a single-crystal pulling device with four tilted magnetic coils that open downwards.

FIG. 18 is a cross-sectional top-down view of a second embodiment of single-crystal pulling device 61 with the four tilted magnetic coils 62-65. As in the first embodiment of FIG. 16, magnetic coil 62 is disposed opposite magnetic coil 63 with respect to central axis 43, and magnetic coil 64 is disposed opposite magnetic coil 65 with respect to central axis 43. Again, first mid line 66 intersects second mid line 67 at central axis 43. Unlike the first embodiment, however, the planes of each of the coils 62-65 intersect central axis 43 at the same point above cylindrical crucible 39. A first optimal field line (not shown) passes through both coils 62-63 at points that are higher than the lowest points on the coils by 25% of the coil diameter. In addition, a second optimal field line (not shown) passes through both coils 64-65 at points that are higher than the lowest points on the coils by 25% of the coil diameter. The first and second optimal field lines also intersect at central axis 43. The shape of the magnetic field whose highest point falls at the intersection of the first and second optimal field lines is not the low ridge 60 that is between the two tilted magnets of FIG. 15 but rather a small hump.

Figure 19:
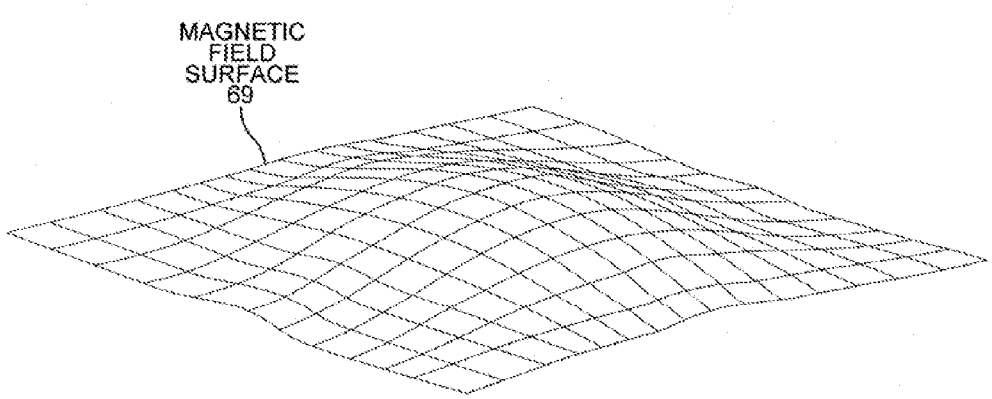
FIG. 19 is a perspective view of a three-dimensional surface of equal magnetic flux density forming a small hump between the four tilted coils of FIG. 18.

FIG. 19 is a perspective view of a three-dimensional surface 69 of equal magnetic flux density between the four tilted coils 62-65 whose highest point falls at the intersection of the first and second optimal field lines. The magnetic field at surface 69 is flatter and more homogeneous than low ridge 60 of FIG. 15 because the small hump on surface 69 is more nearly radially symmetric about central axis 43. As molten semiconductor material 34 rotates in crucible 39 about central axis 43, the magnetic field of surface 68 is more likely to suppress the convective flows of the semiconductor material than merely to stir them. Magnetic field surface 69 exhibits more rotational symmetry with respect to the axis of rotation of the molten semiconductor material 34 than does low ridge 60.

Figure 20:
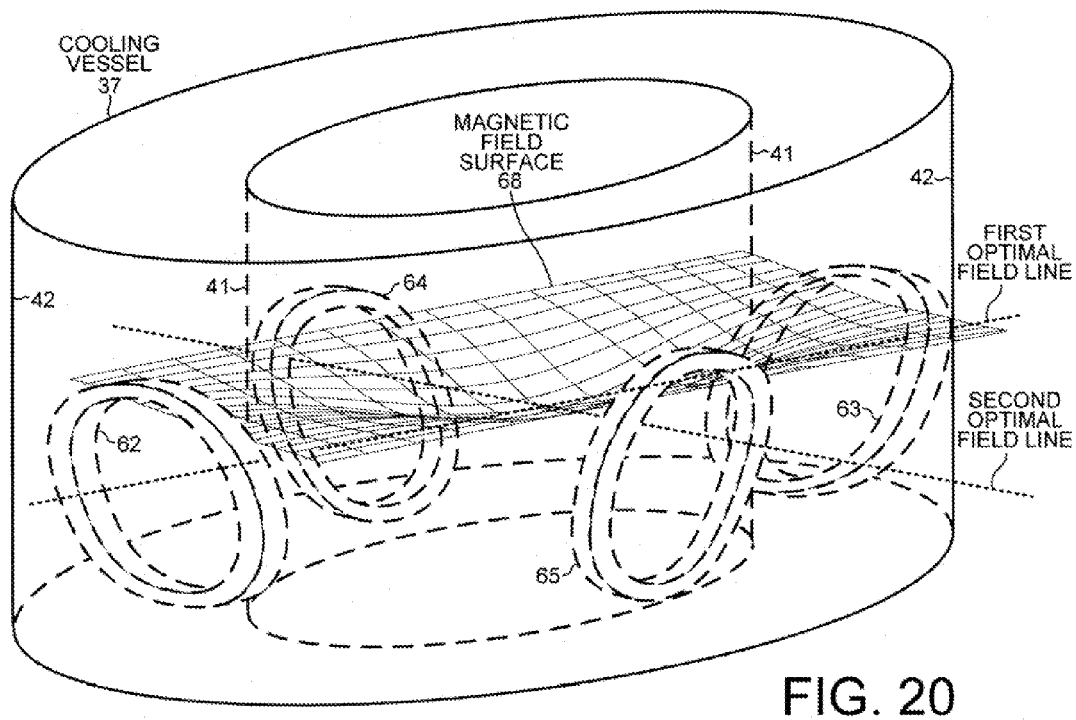
FIG. 20 is a perspective diagram of a cooling vessel with the shallow depression on the surface of FIG. 17 situated between the four coils of FIG. 16 that tilt open upwards.

FIG. 20 is a perspective diagram of cooling vessel 37 illustrating the depression on magnetic field surface 68 in relation to the four tilted magnetic coils 62-65. The shallow depression in surface 68 is generated by the first embodiment of pulling device 61 in FIG. 16 in which the four coils 62-65 are tilted open upwards.

Figure 21:
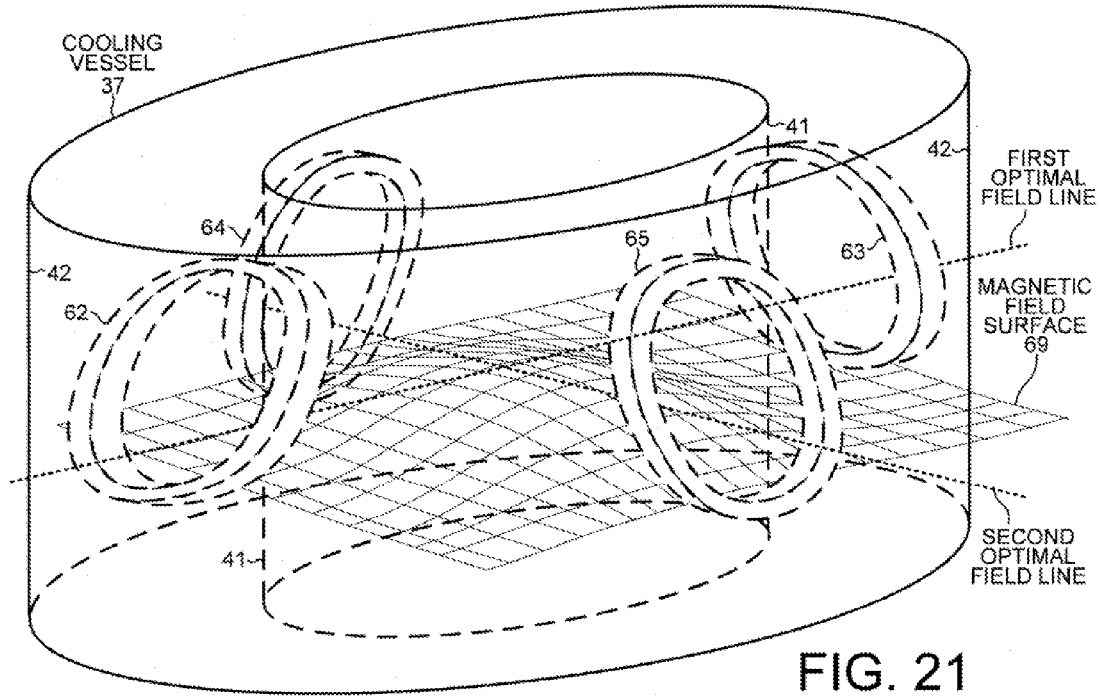
FIG. 21 is a perspective diagram of a cooling vessel with the small hump on the surface of FIG. 19 situated between the four coils of FIG. 18 that tilt open downwards.

FIG. 21 is a perspective diagram of cooling vessel 37 illustrating the small hump on magnetic field surface 69 in relation to the four tilted magnetic coils 62-65. The low hump on surface 69 between tilted coils 62-65 better suppresses the convective flows because the magnetic field better matches the bowed crystallization surface 33 between molten semiconductor material 34 and ingot 35. In operation, crucible 39 is adjusted up and down such that magnetic field surface 69 is just below crystallization surface 33 of molten semiconductor material 34.

Figure 22:
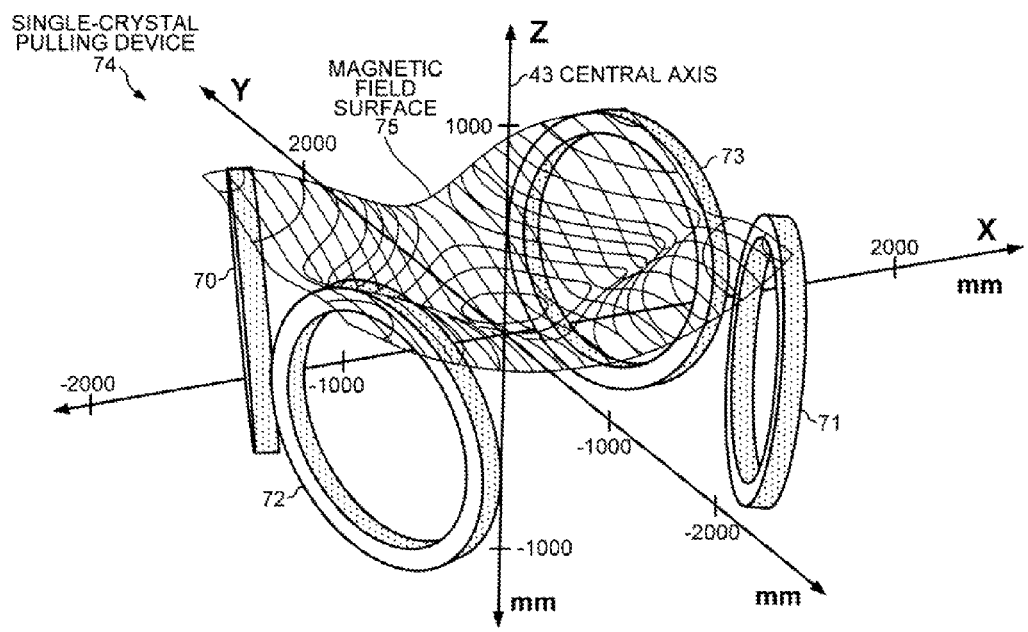
FIG. 22 is a perspective diagram of four magnetic coils of a single-crystal pulling device that tilt open upwards by 5 degrees and that are angled between adjacent coils by 140 degrees.

FIG. 22 is a perspective diagram of four magnetic coils 70-73 of another embodiment of a single-crystal pulling device 74. Coils 70-73 are placed in cooling vessel 37 which is not shown in FIG. 22. Pulling device 74 is made in a commercial scale. Each of the coils 70-73 has a diameter of 1300 millimeters, and the middle points of opposing coils 70-71 and 72-73 are 2400 millimeters apart. The coils generate a magnetic field of six Tesla on the conductor. The coils 70-73 are tilted open upwards in order to generate a flatter field at the crystallization surface 33. Each coil is tilted by five degrees relative to a vertical axis that runs through the lowest point on the coil. Consequently, the plane of each coil also intersects central axis 43 at an angle of five degrees. The opposite coils 70 and 71 do not, however, directly face each other. For example, a line passing through the central axis 43 that is perpendicular to the line at which the plane of first magnetic coil 70 intersects the xy plane does not pass through the middle of coil 70. The opposite coils 72 and 73 also do not directly face each other.

FIG. 22 shows a magnetic field surface 75 of equal magnetic flux density. Optimal field lines pass through both opposing pairs of coils 70-71 and 72-73 at points that are lower than the highest points on the coils 70-73 by about 30% of the coil diameter. Thus, the optimal field lines intersect central axis 43 at a z coordinate of 260 millimeters. (1300 mm×70%-1300 mm/2=260 mm) FIG. 22 shows a magnetic field surface 75 with a shallow depression centered on the xyz coordinate (0, 0, 260). The magnetic flux density at all points on magnetic field surface 75 is about 0.36 Tesla, which is a relatively strong magnetic field for the flatness of magnetic field surface 75.

Figure 23:
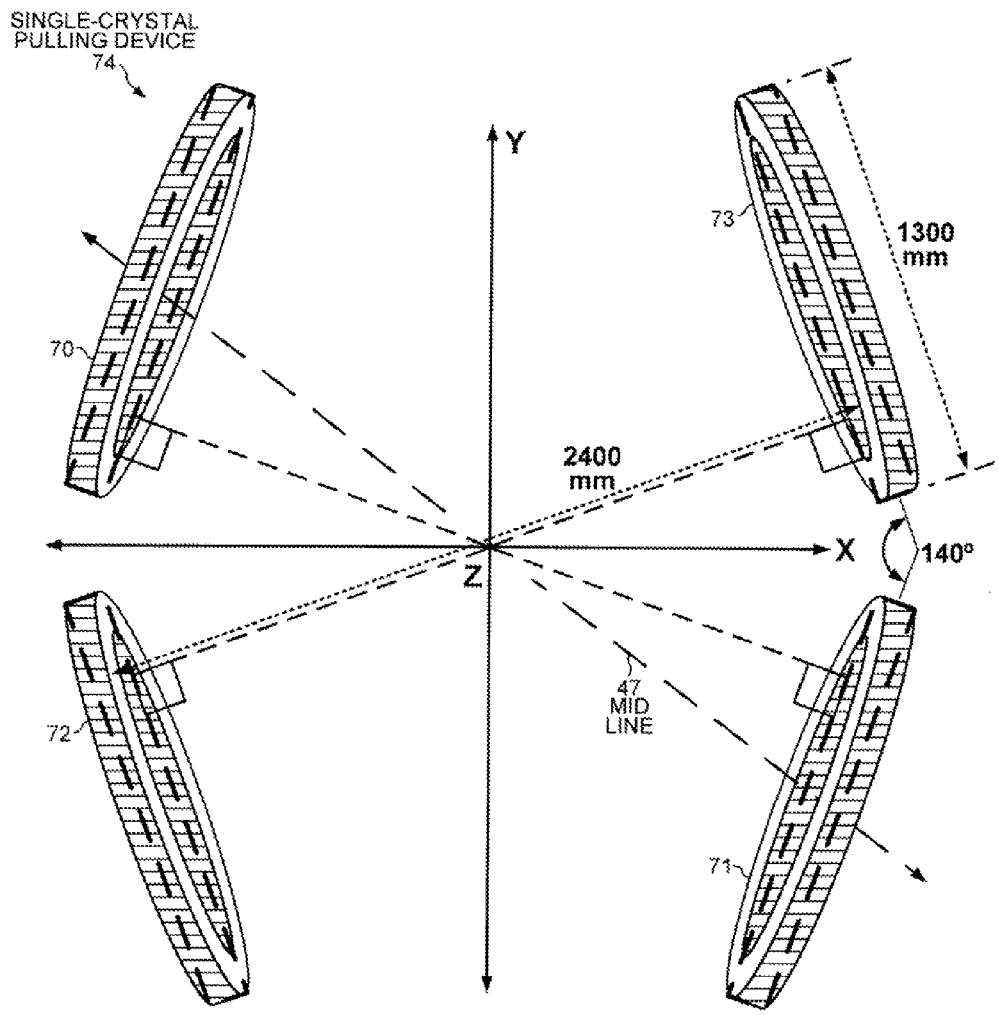
FIG. 23 is a top down perspective view of the four magnetic coils of FIG. 22 showing how adjacent coils are angled by 140 degrees.

FIG. 23 is a top down perspective view of the magnetic coils 70-73 of pulling device 74. FIG. 23 illustrates how the opposite coils 70 and 71 as well as the opposite coils 72 and 73 do not directly face each other. Nevertheless, a mid line 47 that passes through the middles of opposite coils 70 and 71 intersects central axis 43. Likewise, a mid line that passes through the middles of opposite coils 72 and 73 also intersects central axis 43. The line at which the plane of first magnetic coil 70 intersects the xy plane forms an angle of about 140 degrees with the line at which the plane of the adjacent third magnetic coil 72 intersects the xy plane. Similarly, the line at which the plane of second magnetic coil 71 intersects the xy plane forms an angle of about 140 degrees with the line at which the plane of the adjacent fourth magnetic coil 73 intersects the xy plane, as illustrated in FIG. 23. Each of the coils 70-73 is tilted open upward by five degrees relative to a vertical axis that runs through the lowest point on the coil. The planes of each of the four coils 70-73 intersect central axis 43 at the same point and each at an angle of 5 degrees.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A device comprising:
   a cooling vessel with an inside wall, an outside wall and a central axis, wherein the inside wall and the outside wall are coaxially aligned about the central axis;
   a first magnetic coil wound in a first plane with a diameter greater than forty centimeters; and
   a second magnetic coil wound in a second plane, wherein the first magnetic coil is disposed opposite the second magnetic coil with respect to the central axis and within the cooling vessel between the inside wall and the outside wall, wherein the central axis intersects the first plane at a point, and wherein the central axis intersects the second plane at the point.

2. The device of claim 1, further comprising:
   a cylindrical crucible, wherein the inside wall of the cooling vessel is coaxially disposed around the cylindrical crucible.

3. The device of claim 1, further comprising:
   a third magnetic coil wound in a third plane; and
   a fourth magnetic coil wound in a fourth plane, wherein the third magnetic coil is disposed opposite the fourth magnetic coil with respect to the central axis and within the cooling vessel between the inside wall and the outside wall, wherein the central axis intersects the third plane at the point, and wherein the central axis intersects the fourth plane at the point.

4. The device of claim 3, wherein an xy plane is perpendicular to the central axis, wherein the first plane intersects the xy plane at a first intersect line, wherein the third plane intersects the xy plane at a second intersect line, and wherein the first intersect line intersects the second intersect line at an angle greater than 135 degrees.

5. The device of claim 3, wherein the first magnetic coil has a first middle point, the second magnetic coil has a second middle point, the third magnetic coil has a third middle point and the fourth magnetic coil has a fourth middle point, wherein a first mid line passes through the first middle point, the central axis and the second middle point, wherein a second mid line passes through the third middle point, the central axis and the fourth middle point, and wherein the first mid line intersects the second mid line at the central axis.

6. The device of claim 5, wherein an xy plane passes through the first middle point, the second middle point, the third middle point and the fourth middle point, wherein the first plane intersects the xy plane at a first intersect line, wherein the third plane intersects the xy plane at a second intersect line, and wherein the first intersect line intersects the second intersect line at an angle greater than 135 degrees.

7. A device comprising:
   a cylindrical crucible;
   a cooling vessel with an inside wall, an outside wall and a central axis, wherein the inside wall of the cooling vessel is coaxially disposed around the cylindrical crucible;
   a first magnetic coil looping in a first plane; and
   a second magnetic coil looping in a second plane, wherein the first magnetic coil is disposed opposite the second magnetic coil with respect to the central axis and within the cooling vessel between the inside wall and the outside wall, and wherein the first plane intersects the central axis at a first angle with a range between 5 and 15 degrees.

8. The device of claim 7, wherein the second plane intersects the central axis at a second angle, and wherein the first angle equals the second angle.

9. The device of claim 7, wherein the central axis intersects the first plane at a point, and wherein the central axis intersects the second plane at the point.

10. The device of claim 7, wherein the first magnetic coil has a diameter of at least forty centimeters.

11. The device of claim 7, wherein the first plane intersects the central axis below the cylindrical crucible, wherein the second plane intersects the central axis below the cylindrical crucible at a second angle, and wherein the first angle equals the second angle.

12. The device of claim 7, wherein the first plane intersects the central axis above the cylindrical crucible, wherein the second plane intersects the central axis above the cylindrical crucible at a second angle, and wherein the first angle equals the second angle.

13. The device of claim 7, wherein an upper surface of molten semiconductor material is present in the cylindrical crucible, wherein the first magnetic coil has a diameter that equals a diameter of the second magnetic coil, and wherein the cylindrical crucible is located such that the upper surface of the molten semiconductor material is between 20% and 30% of the diameter of the first magnetic coil lower than the highest point of the first magnetic coil.

14. The device of claim 7, further comprising:
   a third magnetic coil looping in a third plane; and
   a fourth magnetic coil looping in a fourth plane, wherein the third magnetic coil is disposed opposite the fourth magnetic coil with respect to the central axis and within the cooling vessel between the inside wall and the outside wall, and wherein each of the first plane, the second plane, the third plane and the fourth plane intersects the central axis at the same point.

15. The device of claim 14, wherein an xy plane is perpendicular to the central axis, wherein the first plane intersects the xy plane at a first intersect line, wherein the third plane intersects the xy plane at a second intersect line, and wherein the first intersect line intersects the second intersect line at an angle greater than 135 degrees.

16. A method comprising:
   pulling a single crystal of semiconductor material from molten semiconductor material in a cylindrical crucible, wherein a cooling vessel has an inside wall, an outside wall and a central axis, and wherein the inside wall of the cooling vessel is coaxially disposed around the cylindrical crucible; and
   generating a magnetic field through the molten semiconductor material so as to suppress convection flows within the molten semiconductor material, wherein the magnetic field is generated using a first magnetic coil wound in a first plane and a second magnetic coil wound in a second plane, wherein the first magnetic coil is disposed opposite the second magnetic coil with respect to the central axis and within the cooling vessel between the inside wall and the outside wall, and wherein the first plane intersects the central axis at a first angle with a range between 5 and 15 degrees.

17. The method of claim 16, wherein the first magnetic coil has a first middle point, wherein the second magnetic coil has a second middle point, wherein a mid line passes through the first middle point, the central axis and the second middle point, and wherein the mid line passes through the molten semiconductor material.

18. The method of claim 16, wherein the first magnetic coil has a first middle point, wherein the second magnetic coil has a second middle point, wherein a mid line passes through the first middle point, the central axis and the second middle point, and wherein the mid line passes above an upper surface of the molten semiconductor material.

19. The method of claim 16, wherein the first magnetic coil has a diameter that equals a diameter of the second magnetic coil, wherein an optimal field line passes through a first point on the first plane that is between 20% and 30% of the diameter lower than the highest point of the first magnetic coil, and wherein the optimal field line passes through a second point on the second plane that is between 20% and 30% of the diameter lower than the highest point of the second magnetic coil, further comprising:

maintaining the cylindrical crucible at a height such that the optimal field line passes approximately through an upper surface of the molten semiconductor material.

20. A device comprising:

a crucible adapted to hold a molten semiconductor material;

a cooling vessel with a central axis, wherein the cooling vessel is coaxially disposed around the crucible; and means for generating a magnetic field centered on the central axis that is not symmetrical above and below any xy plane that is perpendicular to the central axis, wherein the magnetic field is at least 0.03 Tesla at some point along the central axis.

21. The device of claim 20, wherein the means includes a first coil looping in a first plane and a second coil looping in a second plane, wherein the first coil is disposed opposite the second coil with respect to the central axis, and wherein the first plane intersects the central axis at an angle with a range between 5 and 15 degrees.

22. The device of claim 20, wherein the means includes a first coil looping in a first plane and a second coil looping in a second plane, an xy plane is perpendicular to the central axis and intersects the crucible, wherein the first plane intersects the xy plane at a first intersect line, wherein the second plane intersects the xy plane at a second intersect line, and wherein the first intersect line intersects the second intersect line at an angle greater than 135 degrees.

\* \* \* \* \*